United States Patent [19]

Miki et al.

[11] Patent Number: 5,343,353
[45] Date of Patent: Aug. 30, 1994

[54] SEMICONDUCTOR DEVICE AND PROCESS OF PRODUCING THE SAME

[75] Inventors: Hiroshi Miki, Kokubunji; Yuzuru Ohji, Tokyo; Shinichi Tachi; Keiichi Kanehori, both of Sayama, all of Japan

[73] Assignee: Hitachi, Ltd., Tokyo, Japan

[21] Appl. No.: 929,918

[22] Filed: Aug. 17, 1992

[30] Foreign Application Priority Data

Aug. 28, 1991 [JP] Japan .................. 3-216891

[51] Int. Cl.$^5$ .................. H01G 4/10; H01G 7/00; B05D 5/12
[52] U.S. Cl. .................. 361/322; 29/25.42; 427/126.3
[58] Field of Search .................. 505/1; 427/126.3; 29/25.42; 361/323, 321.1, 321.2, 321.4, 321.5, 322

[56] References Cited

U.S. PATENT DOCUMENTS

| | | | |
|---|---|---|---|
| 4,872,086 | 10/1989 | Huang et al. | 361/321 |
| 4,931,427 | 6/1990 | Chien | 505/1 |
| 4,982,309 | 1/1991 | Shepard | 361/321 |
| 5,028,455 | 7/1991 | Miller et al. | 427/126.3 |
| 5,138,401 | 8/1992 | Yamazaki | 505/1 X |
| 5,198,269 | 3/1993 | Swartz et al. | 427/226 |

FOREIGN PATENT DOCUMENTS 1-251760 10/1989 Japan .
2-199879 8/1990 Japan .

OTHER PUBLICATIONS

"Preparation of Ferroelectric Compounds," J. Fukushima, et al., Journal of Materials Science, 19 (1984) pp. 595-598.

Japanese Journal of Applied Physics, vol. 28, No. 6, Jun. 9, pp. 1030-1034, "Preparation of c-Axis-Oriented PbTiO3 Thin Films by MOCVD Under Reduced Pressure", Okada et al.

Journal of Applied Physics, vol. 48, No. 7, Jul. 1977, pp. 2905-2909, "Some Electrical and Optical Properties of Ferroelectric Lead-Zirconate-Lead-Titanate Thin Films", Okada et al.

Journal of Applied Physics, vol. 64(5), Sep. 1, 1988, pp. 2717-2724, "Preparation of Pb(Zr,Ti)O3 Thin Films by Sol Gel Processing: Electrical, Optical, and Electro-Optic Properties", Yi et al.

Applied Physics Letters, 56(24), Jun. 11, 1990, pp. 2399-2401, "Observations of Ferroelectric Polarization Reversal in Sol-Gel Processed Very Thin Lead-Zirconate-Titanate Films", Sanches et al.

*Primary Examiner*—Bruce A. Reynolds
*Assistant Examiner*—Michael D. Switzer
*Attorney, Agent, or Firm*—Fay, Sharpe, Beall, Fagan, Minnich & McKee

[57] ABSTRACT

A microminiature, large capacitor for a semiconductor memory is formed from a raw material compound of plural different kinds of metal atoms for deposition, irrespective of the material, temperature and surface condition of a substrate, thereby forming a thin dielectric film having uniform characteristics not affected by the interface even though the film is made as thin as approximately 0.1 μm. The microminiature large capacitance capacitor has a capacitance unaffected by an oxide existing at the interface between a ferroelectric and electrodes without using precious metals such as platinum having the least degree of freedom in deposition of thin films and microminiature processing. The ferroelectric thin film is deposited using an organic metal comprising a plurality of kinds of metal elements in conformity with the composition of a desired dielectric. As electrodes for use in forming a capacitor, a substance exhibiting conductivity after oxidation is preferably employed.

51 Claims, 9 Drawing Sheets

SEMICONDUCTOR DEVICE AND PROCESS OF PRODUCING THE SAME

BACKGROUND OF THE INVENTION

The present invention relates to a ferroelectric film and to a semiconductor device having a microminiature, large capacitance capacitor using such a film.

Capacitors using ferroelectric thin films are useful as microminiature, large capacitance capacitors, particularly for large scale integrated circuits. It has been mentioned: in the Japanese Journal of Applied Physics 28 (1989), pp 1,030–1,034 to form a lead titanate ($PbTiO_3$) film by introducing raw materials of $Ti(i-oC_3H_4)_4$ and $Pb(C_2H_5)^4$ into a CVD reactor while controlling introduced quantities by controlling the raw material temperatures or the flow of carrier gases; in the Journal of Applied Physics 48 (1977), pp 2,905–2,909 to form a lead titanate zirconate $Pb(Zr,Ti)O_3(PZT)_4$ film by sputtering, using a target oxide comprising metal atoms such as titanium, lead and zirconium; and in the Journal of Applied Physics 64 (1988), pp 2,717–2,724 to form a PZT film by applying prepolymerized organic metal.

SUMMARY OF THE INVENTION

It is an object of the present invention to identify, analyze and solve the problems found in the prior art.

With respect to known capacitors with the ferroelectrics formed by sputtering or chemical vapor deposition on bottom electrodes, the materials of the bottom electrodes are restricted to those resistant to oxidation, because oxygen is in the atmosphere during the formation of the ferroelectrics. Moreover, the oxygen contained in a ferroelectric thin film itself may react with the bottom or top electrodes to produce a thin oxide film, about 10 nm or thinner, which acts as serial capacitance with respect to the capacitance of the ferroelectric thin film and generally this serial capacitance is smaller than that of the ferroelectric itself. The problem is that the whole capacitance is determined not by the ferroelectric capacitor but by the serial capacitance. For this reason, the known practice is to use precious metals, like platinum, which are resistant to oxidation as materials for capacitor electrodes. Evaluation of electric characteristics resulting from the use of such precious metals has been demonstrated in the Applied Physics Letters 56 (1990), pp 2,399–2,401.

The prior art described above for the manufacture of ferroelectric capacitors failed to provide a desired capacitance value and to form a capacitor in a desired configuration. Inquiries into the reasons for such failure proved the following: a region greatly different in composition from a desired region was formed at the interface between the thin film ferroelectric and a substrate because of the behaviors of raw materials on the surface of the substrate and because adsorption, desorption, decomposition and migration at the initial stage of film formation varied with the organic raw materials, the sputtered atoms and the compound; the substance readily deposited at the initial stage was strongly dependent on the temperature of the substrate, the surface material and the adsorption material; not only the deterioration but also variations of the electric characteristics of the ferroelectric film tended to grow greater than those of a thick ferroelectric film because the interfacial material was uncontrollable when the ferroelectric film involved was 0.1 μm or thinner; moreover, apart from the restriction imposed on the selection of materials for the substrate and on surface processing, the ferroelectric film characteristics were drastically fluctuated by a small variation of the conditions of preparation. In the case of a method of applying polymerized raw material, ferroelectric film thickness controllability essential for the deposition of a thin ferroelectric film remains unavailable and use is limited to films thicker than several μm.

Ferroelectric films of the prior art are restricted in configuration when precious metals such as platinum are used as electrode materials and are normally formed by sputtering. In making a dynamic random access memory (DRAM), as an example, to increase capacitor area it is necessary to form the ferroelectric thin film on an electrode of three-dimensional structure, as represented by a stacked or trench capacitor, in order to ensure large scale integration. However, there exists no thin film forming techniques available for a precious metal such as platinum that can meet such a three-dimensional structure requirement. In addition, there exists no dry etching techniques applicable to precious metals that are indispensable as electrodes when ferroelectrics are to be processed into films as thin as μm or less.

When the desired capacitance of the prior art capacitor is comparatively small, a ferroelectric may be formed and the oxidation of the electrode is tolerated to a certain extent. However, the oxide formed at the interface between the ferroelectric and the electrode in this case often becomes amorphous and as this results in reducing the crystallizability of the ferroelectric, the dielectric constant of the ferroelectric itself decreases.

An object of the present invention is to provide a semiconductor device having a microminiature, large capacitance capacitor that is provided with such a thin dielectric film that even though the film is as thin as approximately 0.1 μm, it remains unaffected by the interface between ferroelectrics and electrodes and has uniform characteristics, and the capacitance of which is not practically affected by an oxide existing at the interface.

The foregoing object is accomplished by employing an organic molecule comprising more than one kind of metal atom to be contained in the ferromagnetic film composition as raw material for thin film deposition, and/or by employing a metal or compound that does not lose conductivity by oxidation as capacitor electrodes.

In forming a thin film organic molecule comprising more than one kind of metal atom as ferroelectric material, the composition of the interface between a substrate and the ferroelectric dielectric can be accurately maintained as desired, irrespective of the surface condition, temperature, and material of the substrate as the film composition is determined by the percentage of the number of atoms different in kinds contained in the raw material.

When the electrode material is an oxide, the formation of another oxide is prevented at the interface. In the case of a metal or a compound, the oxide thus formed can be regarded as part of the electrode as it is conductive even when the oxygen contained in the ferroelectric diffuses or when the electrode itself oxidizes, so that the capacitance value of the capacitor is prevented from decreasing. Further, the use of an oxide having a crystalline lattice structure similar to that of the dielectric as a material oxide for the electrode has the effect of attaining epitaxial growth of the dielectric in addition to the effects described above.

These effects permit the present invention to be implemented in the form of a microminiature, large capacitance capacitor, particularly a microminiature, large capacitance semiconductor storage device.

BRIEF DESCRIPTION OF THE DRAWINGS

Further objects, features and advantages will become more clear from the following detailed description of the drawings, wherein.

DETAILED DESCRIPTION OF THE PREFERRED EMBODIMENT

An embodiment of the present invention will be described.

Due to the fact that a new oxide film is deterred from being formed at the interface or a reduction in capacitance resulting from the formation of an oxide film at the interface is prevented, e.g. when oxide is formed at the time of heat treatment after the formation of a capacitor as described later, the above effects of the present invention are obtained irrespective of the method of producing the ferroelectric dielectrics.

FIG. 1(a)–(e) respectively show five molecules as examples of structures of composite metal organic compounds for use in the present invention. In this case: M refers to one metal atom, for example one of lead, zirconium and titanium atoms: R refers to an organic group for example of carbon, nitrogen and oxygen atoms: and 0 refers to an oxygen atom.

Figure 1:
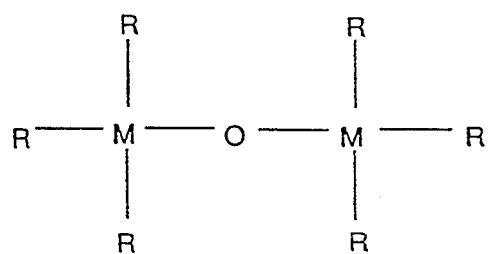
FIGS. 1 (a)–(e) are a diagrams showing exemplary composite organic raw materials for use in the present invention.
Figure 1:
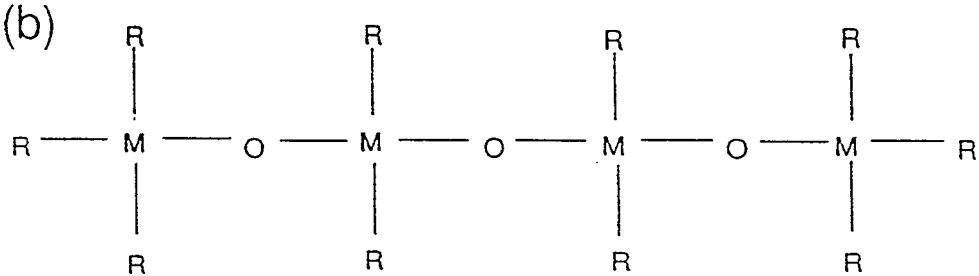
Figure 1:
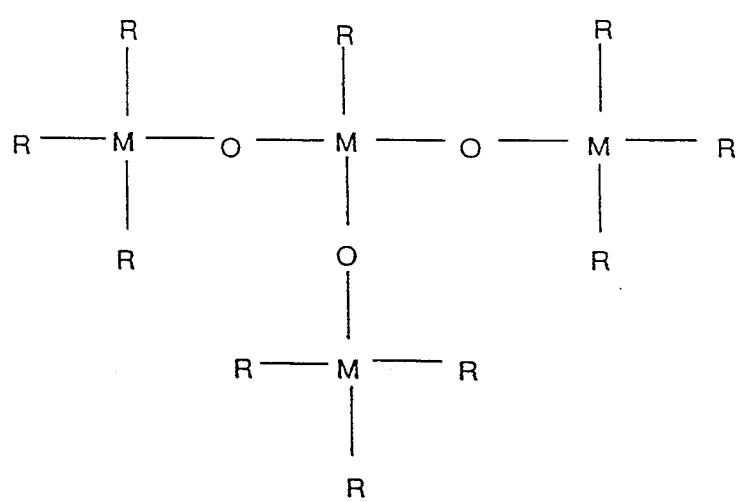
Figure 1:
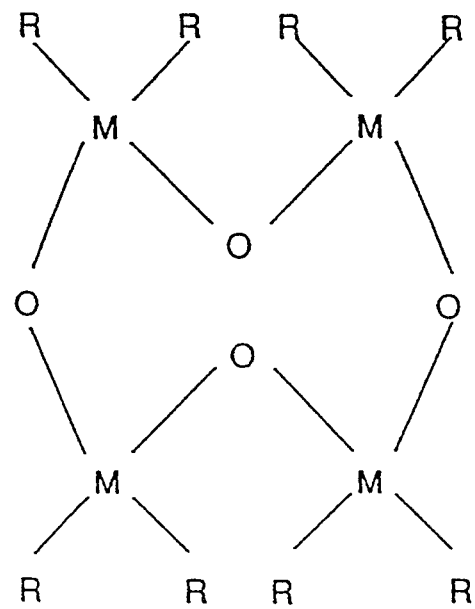
Figure 1:
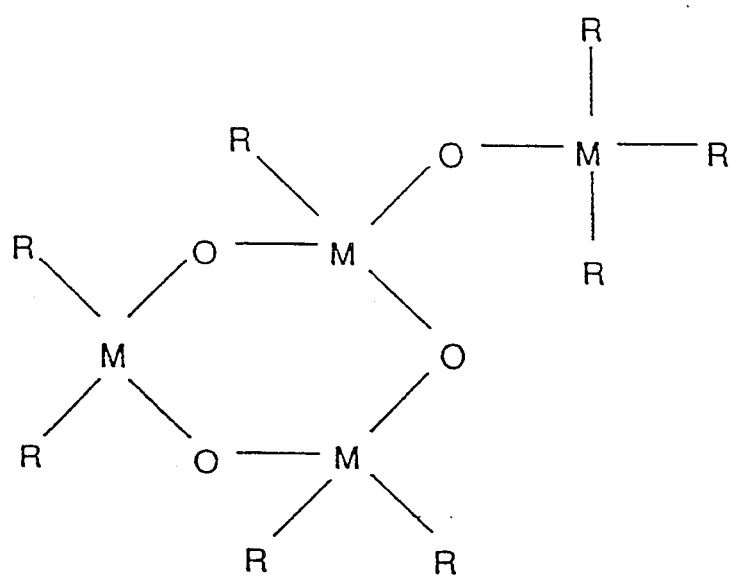

Although M in FIG. 1 represents one metal atom, at least two different kinds of metal atoms are actually combined stoichiometrically as a composition in one molecule. In concrete terms, a compound of FIG. 1 (a) contains two different kinds of Ms and for example represents three different kinds of raw materials, namely, lead and zirconium, zirconium and titanium, and titanium and lead. Each of the compounds of FIGS. 1 (b), (c), (d) and (e) contains four Ms, two of which are lead atoms, whereas the remaining two are a combination of zirconium and titanium, zirconium and zirconium or titanium and titanium. Although M in FIG. 1 is shown with four bonds, the effect of the present invention is achievable even though the lead is bivalent when M is a lead atom and combined with more than one R. More specifically, the lead may be bivalent in the composition in which the leftmost M of FIG. 1 (a) is lead and consequently combined with only one R in addition to the one O. This is also the case with FIG. 1(b) and (d). In the cases of FIG. 1(c) and (e), the lead may be bivalent except when combined with three oxygen atoms.

Although one example of the organic group represented by R has been signified, the organic group may be any organic kind.

These compounds of FIG. 1 may be synthesized through the condensation polymerization of lead compounds and alkoxyide compounds during the process of preparing a spin-on solution in the Sol-Gel method. Variations in the length of a chain combining titanium and lead atoms with oxygen and in the number of branches depend on the degree of pollrmerization. The solution resulting from the polymerization is a mixture of composite organic compounds comprising diversified chains, and by refining the product, an organic compound of stoichiometric composition is obtained. Bivalent lead and titanium was used in a compound of the type of FIG. 1(a) to form a thin lead titanate film. The ratio of the number of titanium atoms to that of lead atoms contained in the organic compound is 1:1, so that the ratio is set in conformity with the stoichiometric composition of the lead titanium to be formed on the surface. The organic compound may have a ratio of titanium reduced 1% or less, in terms of the number of titanium atoms in the organic molecule, a ratio of lead reduced 10% or less in terms of the number of lead atoms in the organic molecule.

Figure 2:
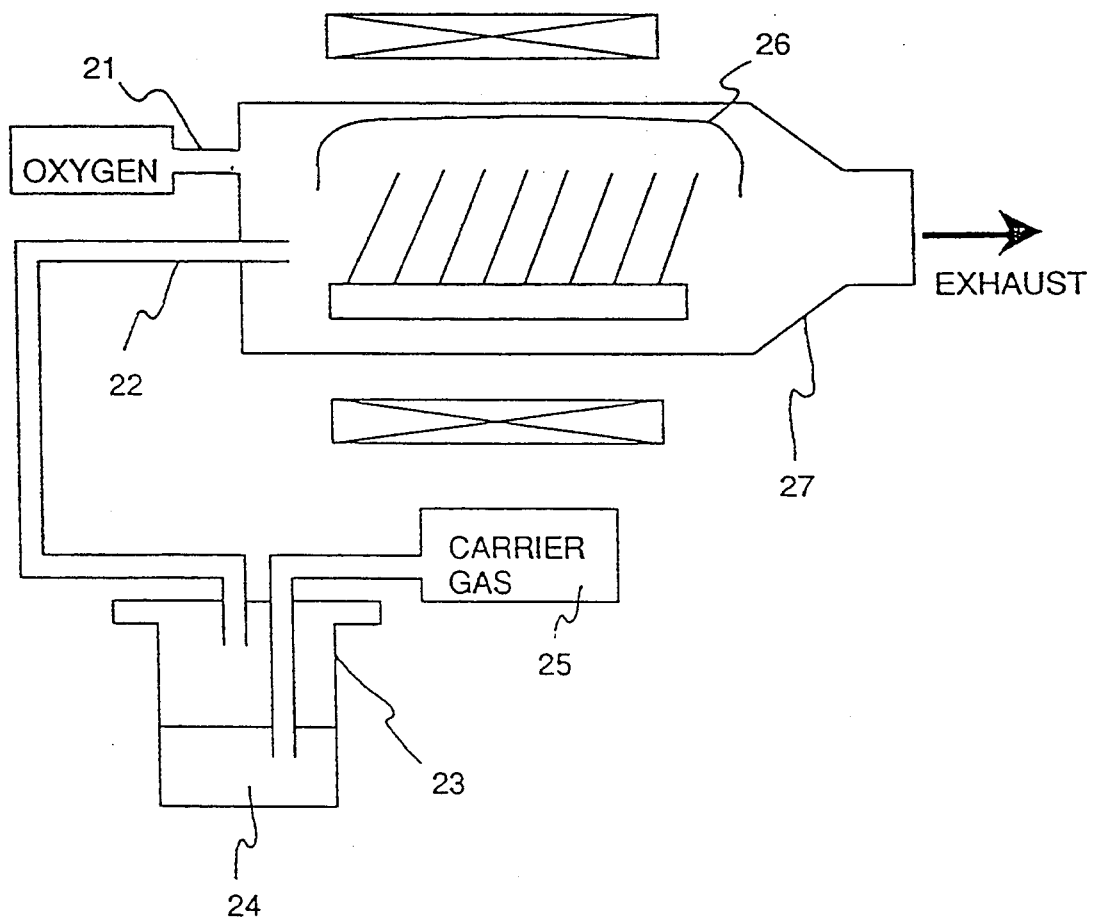
FIG. 2 is a block diagram of a CVD apparatus used in the present invention.

FIG. 2 illustrates the construction of an apparatus for MOCVD using one of the raw materials described with respect to FIGS. 1(a)–(e). The raw material 24 is heated in a cylinder 23 and is sublimated or vaporized before being introduced as vapor through through inlet pipe 22 into a reactor 27 by means of a carrier gas 25.

EXAMPLE 1

Complex organic compound raw material from pipe 22 arriving on silicon substrates 26 with platinum electrode films heated at 600° C. was subjected to thermal decomposition and caused to dispense an organic group, whereby chains comprising at least two kinds of metal and oxygen are deposited on the substrate. Additional oxygen, $O_2$, if needed is supplied from pipe 21. Substrate heating temperatures range from 400° C. at which the reaction rate of the thermal decomposition is practical to 700° C. at which the vapor pressure of the lead oxide may be ignored. The complex organic compound left on the substrate is changed thereon so that it has the structure of lead titanate.

Figure 3:
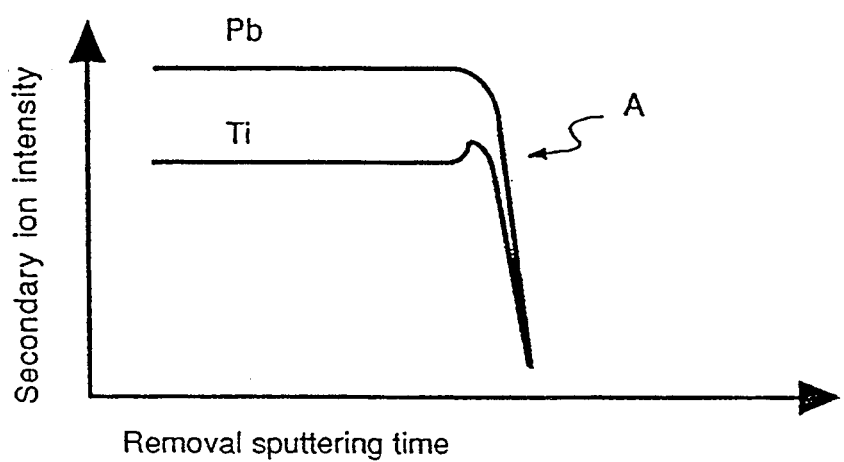
FIGS. 3(a) and (b) are graphic representations illustrating evaluations of composition control effects based on SIMS measurements of examples according to the prior art and the present invention, respectively.
Figure 3:
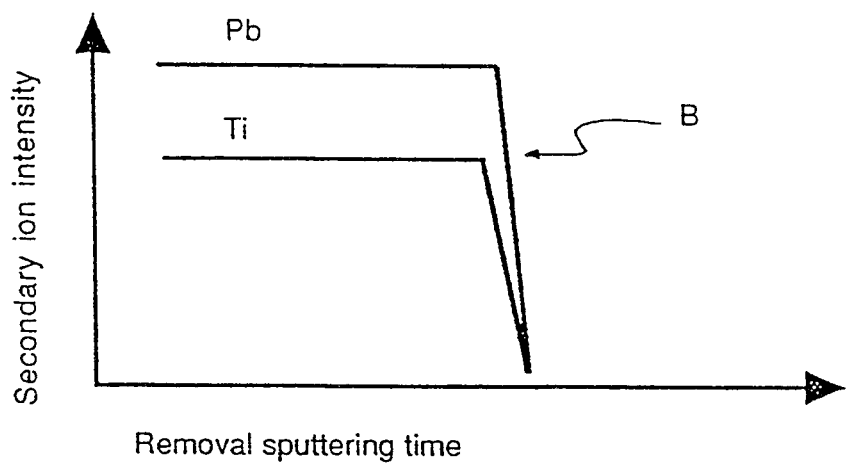

FIG. 3(a) shows the results of measurement of atomic distribution vs dielectric film thickness, of a thin lead titanate film prepared according to the prior art by mixing and introducing two separate organic metal compounds, each comprising a single known metal (respectively Pb & Ti). FIG. 3 (b) shows the results of measurement of atomic distribution verses dielectric film thickness, of a thin lead titanate film prepared according to the present invention as set forth in the preceding paragraph. The measurements shown in both FIG. 3(a) and FIG. 3(b) were made using secondary ion mass spectrometry (SIMS), wherein the ferroelectric film is removed by sputtering, so that the removal sputtering time corresponds to dielectric film thickness, and wherein the secondary ion intensity was measured with the different kinds of metal, mainly Pb and Ti, and therefore corresponds to atomic distribution. The films, whose results are shown in FIGS. 3(a) and 3(b), differ only in that the prior art (FIG. 3(a)) uses raw material 24 having separate material compounds of Pb and Ti, respectively, whereas the present invention (FIG. 3(b)) uses only the single organic compound having both Pb and Ti in each molecule as the raw material 24, as discussed in the preceding paragraph, and the ion mass spectrometry measurements were the same for each of the two resulting films, which films were the same thickness and deposited on the same electrodes by the same apparatus. The lead atomic distribution is seen to lower in FIG. 1(a) in the neighborhood of the ferroelectric/electrode interface of the film prepared by a known method, because the lead oxide exhibits higher vapor pressure and is not readily adsorbed on the base substrate, i.e. electrode. According to the present invention, on the other hand, as seen in FIG. 3(b), since the decomposition product is a composite oxide of titanium and lead, the vapor pressure of the product itself is low, whereas its adsorption on the substrate is high as titanium is contained therein. Therefore, the decomposition product is directly deposited and the composition ratio remains uniform over the ferroelectric/electrode interface.

Desorption of lead oxide occurs when the temperature of the electrode substrate exceeds 700° C. and the ferroelectric film composition runs out of the raw material composition. In this case, oxygen is added by pipe 21 to accelerate the reaction for removing the organic group R and simultaneously to supply sufficient oxygen to the stoichiometric composition in the ferroelectric film.

Figure 4:
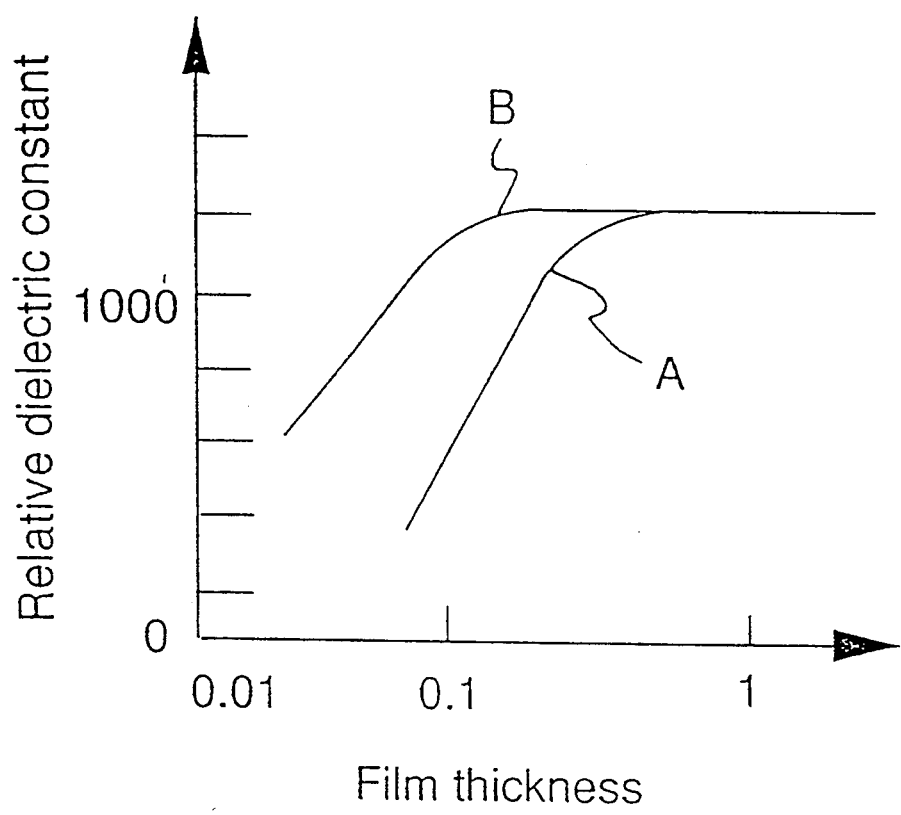
FIG. 4 is a graphic representation illustrating an evaluation of the effect of reducing film thickness according to the present invention.

FIG. 4 depicts the dependence of relative dielectric constant (effective specific inductive capacity and dielectric loss) obtained from the capacitance of capacitors of platinum-lead titanate-platinum construction on the film thickness in connection with the two products A, B of manufacture as shown respectively in FIGS. 3(a) & (b). Since the stoichiometric composition is also present in the neighborhood of the dielectric—substrate (more specifically ferroelectric/electrode) interface in the present invention, the dielectric constant is not decreased and the dielectric loss is not increased even when the film is made thinner. Moreover, the leakage current is reduced as the discontinuity of the interfacial conduction band is improved, so that a rise in breakdown voltage is attained.

EXAMPLE 2

With an apparatus similar to what is shown in FIG. 2, MOCVD was implemented to form a thin film of Pb(Zr, Ti)$O_3$ as a mixed crystal of lead titanate—lead zirconate using a β-diketon complex of lead and a complex organic compound of Zr and Ti (the compound of FIG. 1(a) with the two Ms comprising zirconium and titanium, respectively). However, two raw material supply systems were required receptively for a lead raw material and for a zirconium and titanium composite organic compound raw material. As in the case of Example 1, the substrate temperature ranges from 350° C. to 700° C., the lead raw material heating temperature ranges from 125° C. to 150° C. and the composite organic compound heating temperature ranges from 50° C. to 100° C. The flow of carrier gas was regulated within the range of 20-200 cc/min (in terms of the atmospheric pressure and room temperature) so that the ratio of the number of lead atoms to that of (Zr+Ti) remains in the range of 1.1:1–1:1. Since the composite organic compound is such that the Zr to Ti composition ratio in a molecule conforms to 1:1, the composition ratio of Pb(Zr, Ti)$O_3$ excellent in dielectric characteristics was readily achievable. When such a thin film is prepared by the heretofore known MOCVD, for example before the present invention, control to be exercised over the method of selecting three separate raw materials, the three raw material temperatures and the three flow rates of carrier gases for the different raw materials was restricted and this necessitates precise control. In this Example 2 of the present invention, there is no operational control problem as the Zr to Ti composition ratio is determined by a single raw material. Therefore, a Pb(Zr, Ti)$O_3$ thin film having superior dielectric characteristics was formed with excellent reproducibility.

EXAMPLE 3

By forming a thin film of Pb(Zr, Ti)$O_3$ as a mixed crystal of lead titanate—lead zirconate using a single compound whose composition ratio of lead, titanium and zirconium in a molecule conforms to 2:1:1, a composition whose Pb(Zr, Ti)$O_3$ demonstrated excellent dielectric characteristics was readily attained. The complex organic compound employed was of a kind corresponding to FIGS. 1 (b), (c), (d) and (e) in structure. Two out of four Ms are lead, whereas the remaining two Ms are each a combination of titanium and zirconium. As the lead is introduced onto the substrate while lead atoms are combined via titanium, zirconium and oxygen, the lead composition is left unchanged on the substrate as in the case of the Example 1. Consequently, a dielectric of uniform composition up to the neighborhood of the dielectric/substrate interface could be deposited.

EXAMPLE 4

The MOCVD may employ a composite organic compound of lead and titanium as a raw material (M designates lead and titanium in FIG. 1(a)) and another composite organic compound of lead and zirconium as a raw material (M designates lead and zirconium in FIG. 1(a)) to make it possible to control the mixture ratio of lead titanate to lead zirconate with the mixture ratio of two raw materials. This process is effective in attaining a composition other than Zr:Ti=1:1. It has been known that Pb(Zr, Ti)$O_3$ tends to become structured so that its dielectric characteristics are inferior because of depletion or loss of lead. However, the composition of Zr and Ti is made freely controllable without running out of the lead composition in Examples 3 and 4.

EXAMPLE 5

Figure 5:
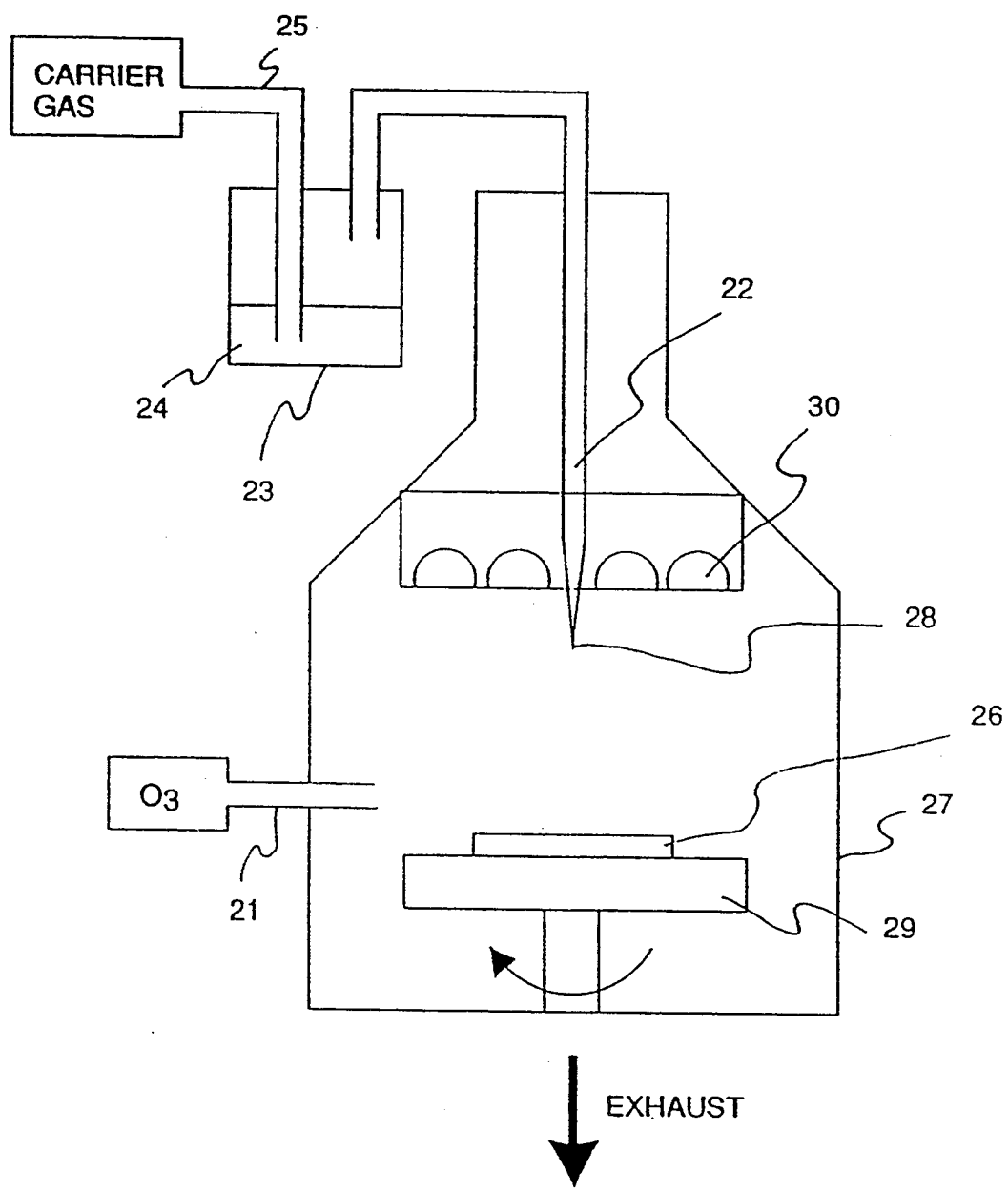
FIG. 5 is a block diagram of a spray-jet deposition apparatus used with the present invention.

The raw materials employed in the Examples 1, 2, 3 and 4 are lower in vapor pressure than, for instance, a liquid iso-propoxide compound of titanium, which for thin film formation by MOCVD of FIG. 5 will have to be introduced into reactor 27 while heated. Therefore, tube 21 to introduce oxygen has to be heated at high temperatures and besides the raw materials are apt to decompose in cylinder 24. In FIG. 5, the raw material 24 is dissolved in a solvent and spray-jetted onto the substrate 26 in ozone from pipe 21 under normal pressures. Raw material liquid is first blown by carrier gas from pipe 25 onto a substrate 26, from the end jet nozzle 28 of pipe 22, while the substrate 26 is being rotated at 3,000 r.p.m. by means of a rotating carrier 29. Halogen lamps 30 are used to heat the liquid at 600° C. to densify the film by evaporating the solvent. A deposition of about 10 nm is possible in one deposition—heating cycle. This process is repeated for film formation until a desired film thickness is obtained so that high-throughput film formation becomes possible.

Figure 6:
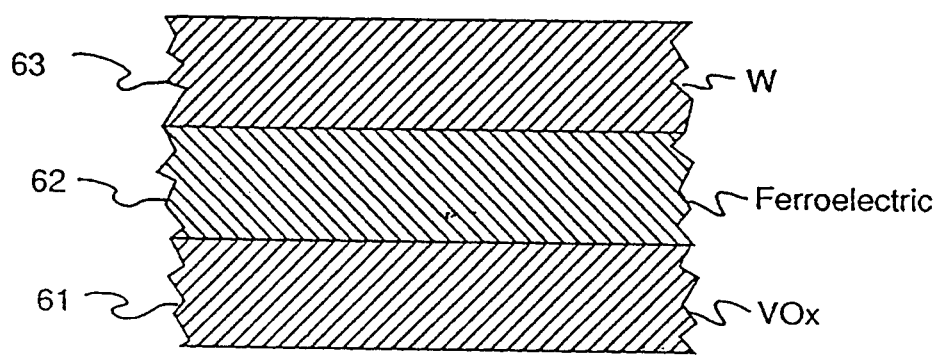
FIG. 6 is a schematic partial sectional view of an example of a capacitor produced by the present invention.

The each of the examples, modifications and variations as set forth above may be employed in making each of the devices of FIGS. 6-10. In FIG. 6 vanadium oxide is employed for electrodes 61, 63 of a capacitor, for example, according to the present invention. In FIG. 6, a bottom electrode 61 is made of the vanadium oxide formed of alkoxyide by MOCVD and the oxide formed at the interface with respect to a ferroelectric 62 becomes conductive, thus the interface oxide does not act as a serial capacitor. Although the oxide at the interface does not become a pure vanadium oxide, depending on the dielectric ferroelectric 62 or the process of producing the ferroelectric 62, the resistance of the interface is kept at low levels and considered to be part of the electrode 61. The ferroelectric 62 is made of more than 90% of perovskite type oxide comprising one or more kinds of atoms selected from the group consisting of Pb, Ca, Ba and Sr, and one or more kinds of atoms selected from the group consisting of Zr, Ti, Sn and Hf. Top electrode 63 is formed after the preparation of the ferroelectric 62. In this case, tungsten was used as the top electrode material since the influence of the interface 62/63 could be avoided by vacuum deposition. The ferroelectric 62 obtained by MOCVD was a Pb(Zr$_{0.5}$, Ti$_{0.5}$)O$_3$ film of 80 nm. The capacitor had a large capacitance of 20 $\mu$F/cm$^2$. If this capacitor is used as a stacked capacitor, a capacitor of 100 fF($10^{-12}$F) with respect to a planar dimension of 0.2 $\mu$m can be attained. In the case of a parallel flat capacitor having platinum electrodes, the capacitance is 40 fF with respect to the same planar dimension. When the bottom electrode is made of silicon, moreover, the capacitance is about 7 fF.

Incidentally, similar effects are obtainable from chromium oxide, iron oxide, ruthenium oxide, indium oxide, tin oxide, rhenium oxide, iridium oxide, lead oxide and a mixture of them in addition to vanadium oxide as far as the bottom electrode is concerned. These oxides are also applicable to the top electrode 63 in FIG. 6. In this case, no reduction in the capacitance value is seen even though heat treatment is made after the preparation of the top electrode 63.

The ferroelectric 62, with oxide as a component, can be lead titanate—lead zirconate (PZT), lead titanate zirconate lanthanum (PLZT), lead zirconate, lead titanate, barium titanate and the like.

Highly conductive oxides are employed for electrodes in FIG. 6. However, satisfactory characteristics are obtainable from circuits, like a DRAM, which are required to offer only a response of the order of nanoseconds or greater even when material having relatively high resistivity is used. In this case, oxides of titanium, copper, palladium and the like are usable for electrode materials. Although the dielectric loss of the capacitor increases, the high frequency response thus obtained is sufficient for practical use.

In the case of a ferroelectric film containing titanium, especially lead titanate, the titanium oxide at the interface prevents leakage current from increasing. Moreover, the effect of reducing leakage current is achievable likewise by upper and lower electrodes of oxide having low resistivity as shown in, for example, FIG. 6, or that partially contain oxides of titanium, lanthanum, tantalum, niobium and uranium.

Figure 7:
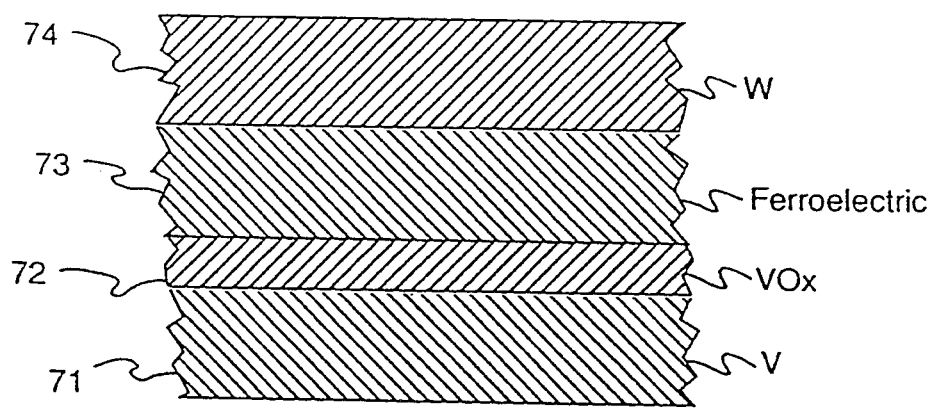
FIG. 7 is a schematic partial sectional view of another capacitor produced by the present invention.

FIG. 7 shows a capacitor, like FIG. 6, where the bottom electrode is formed of vanadium oxide. However, the base 71 prior to the formation of a ferroelectric 73 is made of metallic vanadium, and an oxide 72 secondly forms at the time the ferroelectric is formed, so that the effect of the serial capacitor becomes ignorable. Chromium, iron, ruthenium, indium, tin, rhenium, iridium, lead, titanium, copper, palladium and the like in place of vanadium are also usable.

Figure 8:
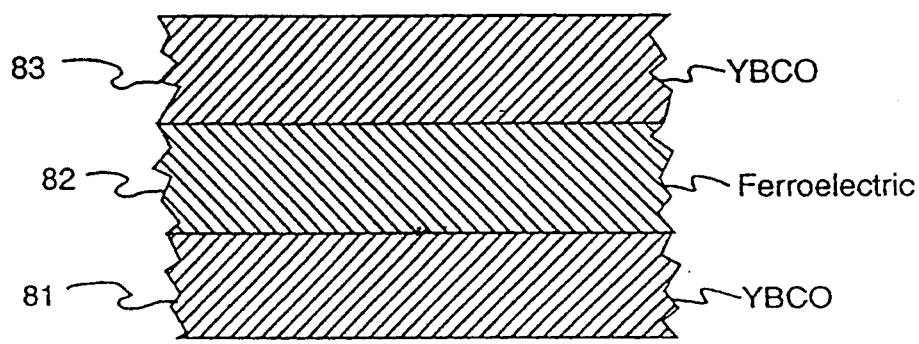
FIG. 8 is a schematic partial sectional view of still another capacitor produced by the present invention.

FIG. 8 shows an example of making a bottom and/or top oxide electrode 81,83 an oxide superconductor. A yttrium barium copper oxide (YBCO) is employed as the oxide superconductor and an oxide superconductor that is of a different perovskite type oxide structure such as bismuth strontium calcium copper oxide (BSCCO) may also be used. In this case, as the bottom electrode 81 and a ferroelectric 82 are the same crystalline structure, in addition to the effect of FIG. 6, heteroepitaxial growth is made possible and consequently the crystallizability of the ferroelectric is improved. YBCO, which was formed by the chemical vapor deposition of organic metal as raw material according to the present invention, is applied to three-dimensional structure. The same capacitance value as in FIG. 6 at the normal temperature is also obtainable. Moreover, the use of the superconductor at the transition point temperature or lower causes the serial resistance of the capacitor to lower, whereby a large capacitance capacitor excellent in high-frequency response is attainable.

Figure 9:
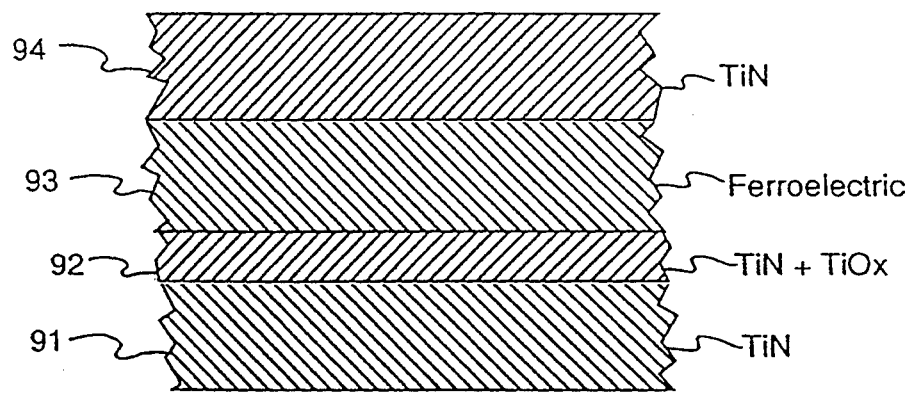
FIG. 9 is a schematic partial sectional view of still a further capacitor produced by the present invention.

FIG. 9 shows a titanium nitride film used for the top and bottom electrodes 94 and 91. Although the titanium nitride film is oxidized in the interface 92 at the temperature at which a ferroelectric 93 is made, the action of the oxidized titanium nitride film thus formed as a serial resistor is ignorable as its resistivity is low and as it is as thin as about 10 nm. In this case for electrodes 91, 94, a film of nitride comprising vanadium, zirconium, niobium, hafnium, tantalum or the like in place of titanium nitride film may be used.

Figure 10:
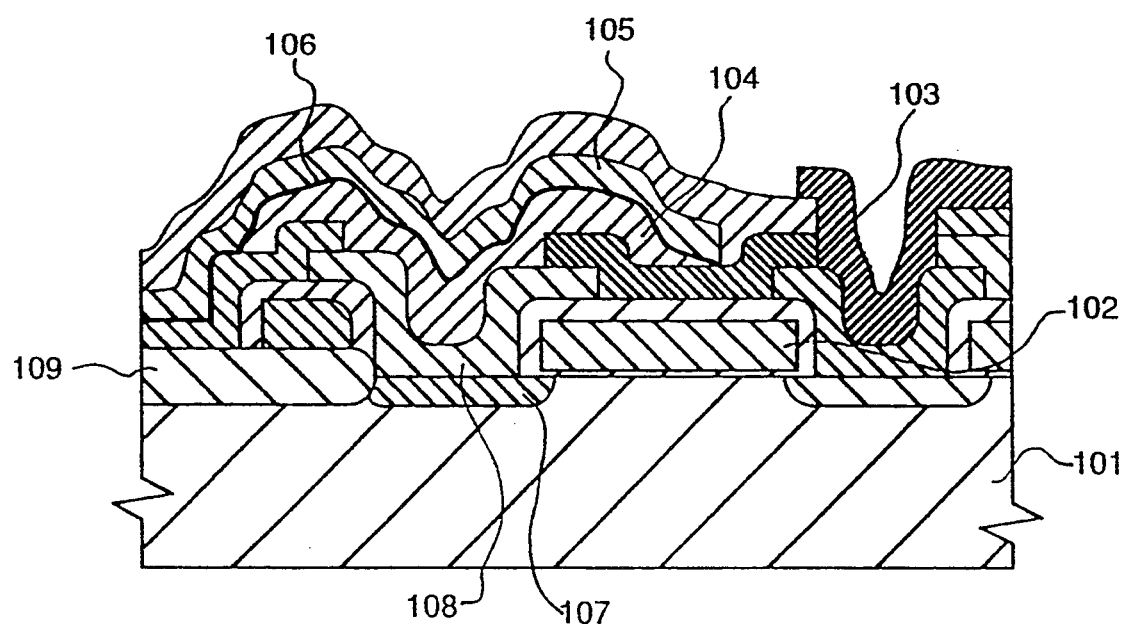
FIG. 10 is a sectional view of a DRAM constructed according to the present invention.

FIG. 10 shows the capacitor of FIG. 8 applied to an ordinary transistor stacked DRAM cell. The DRAM may, alternatively, employ the capacitor of any of the other examples described above. A p-type Si substrate 101 is formed with n-type diffusion layers 107. A field oxide layer 109 is formed on the substrate 101. In a conventional matter, gate electrode 102 is formed together with bit line 103 and conductive layers 108 connecting the diffusion layers 107 and the bottom electrode BSCCO 104. BSCCO 104, 105 were used as superconductors for electrodes of a capacitor. These electrodes are electrically in contact with n-type diffusion layers 107 as electrodes of a MOS transistor forming a transfer gate via Cu 108. Incidentally, connections with peripheral circuits via Cu may also be effective. When the capacitor of FIGS. 6 and 7 are applied to this DRAM, such intermediary layers are effective. As in a case where metallic lead is used for intermediary layers when lead oxides are employed as electrodes, for instance, it is effective to form the intermediary layer with the substance obtain by removing oxygen and elements other than oxygen from an electrode oxide. The resistance generated by electrical contact with the n-type diffusion layer may be reduced by this method.

Since the film composition is determined by percentages in number of different atoms contained in a single composition raw material, the composition of the interface between the substrate and the dielectric can be decided without relying on the surface condition, temperature and material of the substrate according to the present invention. As a result, the present invention is effective in forming a thin dielectric film having characteristics free from being affected by the interface even though the film is as thin as about 0.1 $\mu$m. Moreover, the use of the electrode materials according to the present invention makes it possible to prevent the effective capacitance from lowering by means of the dielectric film having a low dielectric constant, the film being present on the electrode- ferroelectric interface of the capacitor. Therefore, the development of a microminiature, large capacitance capacitor is accomplished according to the present invention with the affect of providing a microminiature, large capacitance semiconductor memory.

While a preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. A method of forming a dielectric film for use in an electronic device, comprising the steps of:
   providing a body in a reactor;
   supplying mainly an organic compound, having each molecule comprising at least a first kind of metal atom and a second kind of metal atom different from the first kind, onto the body within the reactor; and
   heating the organic compound and thereby decomposing the organic molecule for thereby forming a dielectric film having the first kind of metal atom and second kind of metal atom in substantially the same ratio as they existed in the organic compound molecule.

2. The method of claim 1, wherein said forming further comprises reacting the first kind of metal atom with the second kind of metal atom to form a metallic compound in the dielectric film that is different from the organic compound.

3. The method of claim 2, wherein said supplying supplies the first kind of metal atom and the second kind of metal atom as lead and titanium, respectively.

4. The method of claim 3, wherein said step of forming forms the dielectric film as a lead titanate film.

5. The method of claim 3, wherein said step of forming forms the dielectric film as a lead zirconate titanate film.

6. A method of forming an electronic device, comprising the steps of:
   providing a body in a reactor;
   supplying an organic compound, having each molecule comprising at least a first kind of metal atom and a second kind of metal atom different from the first kind, onto the body within the reactor;
   heating the organic compound and thereby decomposing the organic compound molecule for thereby forming a dielectric film having the first kind of metal atom and a second kind of metal atom in substantially the same ratio as they existed in the organic compound molecule;
   wherein said step of supplying further supplies a carrier gas for the organic compound molecule;
   said forming further comprising reacting the first kind of metal atom with the second kind of metal atom to form a metallic compound in the dielectric film that is different from the organic compound;
   said step of providing including forming a first conductive film on the body; and
   after all of said steps, forming a second conductive film on the dielectric film to form a capacitor as at least a part of the electronic device.

7. The method according to claim 6, wherein said step of forming a first conductive film forms the first conductive film as an oxide containing an element selected from the group consisting of vanadium, chromium, iron, ruthenium, indium, tin, rhenium, iridium and lead.

8. The method according to claim 6, wherein said steps of forming the first conductive film and the second conductive film, forms each of the first and second conductive films as an oxide containing an element selected from the group consisting of vanadium, chromium, iron, ruthenium, indium, tin, rhenium, iridium and lead.

9. The method of claim 6, wherein one of said steps of forming forms one of the first and second conductive films as an oxide superconductor.

10. The method of claim 6, wherein
    said step of providing a body includes forming a transistor on the body prior to said step of forming a first conductive film, and wherein said forming the first conductive film electrically connects the first conductive film to the transistor.

11. The method of claim 6, wherein said step of forming the first conductive film forms the first conductive film as an oxide with a crystalline lattice structure, and said step of forming a dielectric film forms the dielectric film by epitaxial growth with a crystalline lattice structure at least similar to the crystalline lattice structure of the oxide so that an interface formed between the dielectric film and the first conductive film is a conductive film electrically a part of the first conductive film.

12. The method of claim 2, wherein said step of supplying further includes supplying additional oxygen to accelerate removal of an organic group from the organic compound molecule as a part of said decomposing and simultaneously to supply any oxygen needed for stoichiometric composition of the dielectric film as a part of said reacting.

13. The method of claim 2, wherein said step of supplying includes supplying a third kind of metal in a molecule separate from the organic compound molecule and depositing the third kind of metal molecule onto the body together with the organic compound molecule so that said reacting and forming forms the dielectric film as a reactive compound of the first, second and third kinds of metal.

14. A method of forming a dielectric film for use in an electronic device, comprising the steps of:
    providing a body in a reactor;
    supplying an organic compound, having each molecule comprising at least a first kind of metal atom and a second kind of metal atom different from the first kind, onto the body within the reactor;
    heating the organic compound and thereby decomposing the organic compound molecule for thereby forming a dielectric film having the first kind of metal atom and second kind of metal atom in substantially the same ratio as they existed in the organic compound molecule; and wherein said step of supplying further supplies a carrier gas for the organic compound molecule.

15. A method of forming a dielectric film for use in an electronic device, comprising the steps of:

providing a body in a reactor;

supplying an organic compound, having each molecule comprising at least a first kind of metal atom and a second kind of metal atom different from the first kind, onto the body within the reactor;

heating the organic compound and thereby decomposing the organic compound molecule for thereby forming a dielectric film having the first kind of metal atom and second kind of metal atom in substantially the same ratio as they existed in the organic compound molecule; and wherein said step of providing a body provides the body in a chemical vapor deposition reactor and said steps of supplying, heating, decomposing and forming are conducted as a part of chemical vapor deposition.

16. The method according to claim 2, wherein said step of supplying, heating, reacting, forming, and decomposing form the dielectric film as a ferroelectric film containing more than 90% of Perovskite type oxide comprising at least one kind of atom in each molecule selected from the group consisting of Pb, Ca, Ba, Sr and one or more kinds of atoms selected from the group consisting of Zr, Ti, Sn, Hf, and as a ferroelectric film with a thickness of less than 0.1 $\mu$m.

17. The method according to claim 2, wherein said steps of supplying, heating, reacting, forming, and decomposing forms the dielectric film as a ferroelectric film with a thickness of less than 0.1 $\mu$m.

18. The method of claim 2, wherein said step of providing a body provides the body in a metal oxide chemical vapor deposition MOCVD reactor and said steps of supplying, heating, reacting, decomposing and forming are conducted as a part of metal oxide chemical vapor deposition.

19. The method of claim 6, wherein all of said steps forms the capacitor with a capacitance at least as great as 20 $\mu$F/cm2.

20. The method of claim 2, wherein all of said steps forms the dielectric film as a ferroelectric oxide, namely lead titanate-lead zirconate (PZT).

21. The method of claim 2, wherein all of said steps forms the dielectric film as a ferroelectric oxide, namely lead titanate zirconate lanthanum (PLZT).

22. The method of claim 2, wherein all of said steps forms the dielectric film as a ferroelectric oxide, namely lead titanate.

23. The method of claim 2, wherein all of said steps forms the dielectric film as a ferroelectric oxide, namely lead zirconate.

24. The method of claim 2, wherein all of said steps forms the dielectric film as a ferroelectric oxide, namely barium titanate.

25. A method of forming an electronic device, comprising the steps of:

providing a body in a reactor;

supplying an organic compound, having each molecule comprising at least a first kind of metal atom and a second kind of metal atom different from the first kind, onto the body within the reactor;

heating the organic compound and thereby decomposing the organic compound molecule for thereby forming a dielectric film having the first kind of metal atom and second kind of metal atom in substantially the same ratio as they existed in the organic compound molecule;

wherein said forming further reacting the first kind of metal atom with the second kind of metal atom to form a metallic compound in the dielectric film that is different from the organic compound;

wherein said step of providing includes forming a first conductive film on the body;

after all of said steps, forming a second conductive film on the dielectric film to form a capacitor as at least a part of the electronic device; and wherein all of said steps forms the dielectric film as a ferroelectric oxide and the first and second conductive films as an oxide of titanium, copper or palladium.

26. The method of claim 2, wherein all of said steps forms the dielectric film as a ferroelectric oxide.

27. The method of claim 6, wherein all of said steps forms the dielectric film as a ferroelectric oxide.

28. A method of forming an electronic device, comprising the steps of:

providing a body in a reactor;

supplying an organic compound, having each molecule comprising at least a first kind of metal atom and a second kind of metal atom different from the first kind, onto the body within the reactor;

heating the organic compound and thereby decomposing the organic compound molecule for thereby forming a dielectric film having the first kind of metal atom and second kind of metal atom in substantially the same ratio as they existed in the organic compound molecule;

wherein said step of providing a body provides the body in a chemical vapor deposition reactor and said steps of supplying, heating, decomposing and forming are conducted as a part of chemical vapor deposition;

said forming further reacting the first kind of metal atom with the second kind of metal atom to form a metallic compound in the dielectric film that is different from the organic compound;

said step of providing including forming a first conductive film on the body; and after all of said steps, forming a second conductive film on the dielectric film to form a capacitor as at least a part of the electronic device.

29. The method of claim 28, wherein all of said steps forms the dielectric film as a ferroelectric oxide.

30. The method of claim 28, wherein sai first and second conductive films are of a substance exhibiting conductivity after oxidation so that an oxide interface between the dielectric film and each of the first and second conducive films is electrically a part of the conductive films, respectively, not the dielectric film.

31. The method of claim 29, wherein said first and second conductive films are of a substance exhibiting conductivity after oxidation so that an oxide interface between the dielectric film and each of the first and second conductive films is electrically a part of the conductive films, respectively, not the dielectric film.

32. The method of claim 15, wherein said step of supplying further supplies a carrier gas for the organic compound molecule.

33. The method of claim 28, wherein said step of supplying further supplies a carrier gas for the organic compound molecule.

34. The method of claim 33, wherein said first and second conductive films are of a substance exhibiting conductivity after oxidation so that an oxide interface between the dielectric film and each of the first and second conductive films is electrically a part of the conductive films, respectively, not the dielectric film.

35. The method of claim 28, wherein said step of forming the first conductive film forms the first conductive film as an oxide with a crystalline lattice structure, and said step of forming a dielectric film forms the dielectric film by epitaxial growth with a crystalline lattice structure at least similar to the crystalline lattice structure of the oxide so than an interface formed between the dielectric film and the first conductive film is a conductive film electrically a part of the first conductive film.

36. The method of claim 25, wherein said first and second conductive films are of a substance exhibiting conductivity after oxidation so that an oxide interface between the dielectric film and each of the first and second conductive films is electrically a part of the conductive films, respectively, not the dielectric film.

37. The method of claim 36, wherein said step of supplying further supplies a carrier gas for the organic compound molecule.

38. A method of forming an electronic device, comprising the steps of:
   providing a body in a reactor;
   supplying an organic compound, having each molecule comprising at least a first kind of metal atom and a second kind of metal atom different from the first kind, onto the body within the reactor;
   heating the organic compound and thereby decomposing the organic compound molecule for thereby forming a dielectric film having the first kind of metal atom and second kind of metal atom in substantially the same ratio as they existed in the organic compound molecule;
   wherein said step of supplying further supplies a carrier gas for the organic compound molecule;
   said forming further comprising reacting a first kind of metal atom with a second kind of metal atom to form a metallic compound in the dielectric film that is different from the organic compound;
   said step of supplying, heating, reacting, forming, and decomposing form the dielectric film as a ferroelectric film containing more than 90% of Perovskite type oxide comprising at least one kind of atom in each molecule selected from the group consisting of Pb, Ca, Ba, Sr and one or more kinds of atoms selected from the group consisting of Zr, Ti, Sn, Hf, and as a ferroelectric film with a thickness of less than 0.1 $\mu$m;
   said step of providing including forming a first conductive film on the body; and
   after all of said steps, forming a second conductive film on the dielectric film to form a capacitor as at least a part of the electronic device.

39. The method of claim 38, wherein said step of forming the first conductive film forms the first conductive film as an oxide with a crystalline lattice structure, and said step of forming a dielectric film forms the dielectric film by epitaxial growth with a crystalline lattice structure at least similar to the crystalline lattice structure of the oxide so than an interface formed between the dielectric film and the first conductive film is a conductive film electrically a part of the first conductive film.

40. The method of claim 38, wherein said first and second conductive films are of a substance exhibiting conductivity after oxidation so that an oxide interface between the dielectric film and each of the first and second conductive films is electrically a part of the conductive films, respectively, not the dielectric film.

41. The method of claim 29, wherein said steps of supplying, heating, reacting, forming, and decomposing forms the dielectric film as a ferroelectric film with a thickness of less than 0.1 $\mu$m; and
   wherein all of said steps forms the capacitor with a capacitance at least as great as 20 $\mu$F/cm$^2$.

42. The method of claim 29, wherein said step of supplying further includes supplying additional oxygen to accelerate removal of an organic group from the organic compound molecule as a part of said decomposing and simultaneously to supply any oxygen needed for stoichiometric composition of the dielectric film as a part of said reacting.

43. The method of claim 6, wherein said first and second conductive films are of a substance exhibiting conductivity after oxidation so that an oxide interface between the dielectric film and each of the first and second conductive films is electrically a part of the conductive films, respectively, not the dielectric film.

44. The method of claim 30 wherein said steps of supplying, heating, reacting, forming, and decomposing forms the dielectric film as a ferroelectric film with a thickness of less than 0.1 $\mu$m; and
   wherein all of said steps forms the capacitor with a capacitance at least as great as 20 $\mu$F/cm$^2$.

45. The method of claim 44, wherein said step of supplying further includes supplying additional oxygen to accelerate removal of an organic group from the organic compound molecule as a part of said decomposing and simultaneously to supply any oxygen needed for stoichiometric composition of the dielectric film as a part of said reacting.

46. The method of claim 43, wherein said steps of supplying, heating, reacting, forming, and decomposing forms the dielectric film as a ferroelectric film with a thickness of less than 0.1 $\mu$m; and
   wherein all of said steps forms the capacitor with a capacitance at least as great as 20 $\mu$F/cm$^2$.

47. The method of claim 43, wherein said step of supplying further includes supplying additionally oxygen to accelerate removal of an organic group from the organic compound molecule as a part of said decomposing and simultaneously to supply any oxygen needed for stoichiometric composition of the dielectric film as a part of said reacting.

48. A method of forming a ferroelectric film, comprising the steps of:
   providing a body in a reactor;
   supplying onto the body within the reactor an organic compound having each molecule comprising at least a first kind of metal atom and a second kind of metal atom different from the first kind, and a carrier gas for the organic compound molecule; and
   heating the organic compound and thereby decomposing the organic compound molecule for thereby forming the ferroelectric film having the first kind of metal atom and second kind of metal atom in substantially the same ratio as they existed in the organic compound molecule.

49. The method of claim 48, wherein said forming further reacting the first kind of metal atom with the second kind of metal atom to form a metallic compound in the ferroelectric film that is different from the organic compound.

50. The method of claim 15, wherein said forming further reacting the first kind of metal atom with the second kind of metal atom to form a metallic compound in the dielectric film that is different from the organic compound.

51. The method of claim 50, wherein said step of supplying further supplies a carrier gas for the organic compound molecule.

* * * * *